United States Patent [19]

Kennedy et al.

[11] 4,075,573
[45] Feb. 21, 1978

[54] INCREMENTAL AGC SIGNAL GENERATOR WITH CONTROLLABLE INCREMENTS

[75] Inventors: Howard L. Kennedy, Phoenix; John Ooms, Tempe, both of Ariz.

[73] Assignee: Motorola, Inc., Schaumburg, Ill.

[21] Appl. No.: 757,116

[22] Filed: Jan. 5, 1977

[51] Int. Cl.² ............................................. H03G 3/20
[52] U.S. Cl. ..................................... 330/129; 330/141
[58] Field of Search ................... 330/29, 86, 127, 129, 330/141, 144, 145; 325/410

[56] References Cited

U.S. PATENT DOCUMENTS

| | | | |
|---|---|---|---|
| 3,375,447 | 3/1968 | Van der Beek | 325/410 |
| 3,619,660 | 11/1971 | Rugo | 330/141 X |
| 3,969,683 | 7/1976 | Fabricius | 330/129 X |

*Primary Examiner*—James B. Mullins
*Attorney, Agent, or Firm*—Eugene A. Parsons

[57] ABSTRACT

A comparator is connected to the output of a variable gain amplifier and, when the output signal exceeds a predetermined threshold, pulses are applied to a plural stage shift register in series, with incremental voltages being generated in parallel at the outputs of the various stages. The incremental voltages are applied to the amplifier to vary the amplification thereof, and a threshold detector and timer also sense the output of the amplifier and reset the shift register when the output of the amplifier is below a predetermined value for at least preset period of time. One or more additional comparators may be included in the circuit to cause the shift register to activate one or more of the higher stages directly when the output of the amplifier exceeds a second predetermined amplitude. A step control circuit for shaping the response curve of the amplifier is also included.

9 Claims, 4 Drawing Figures

INCREMENTAL AGC SIGNAL GENERATOR WITH CONTROLLABLE INCREMENTS

BACKGROUND OF THE INVENTION

An AGC voltage generator is devised for use in combination with a variable gain amplifier. The amplification factor of such an amplifier can be changed with the application of a control voltage thereto. The AGC voltage generator generates the control voltage to adapt the amplifier gain to the magnitude of the input signal level. AGC, or automatic gain control, circuits have been utilized for many years. However, the well known AGC circuits generally do not include any substantial holding time, i.e. the time during which the AGC voltage is applied to the amplifier after the input signal causing the AGC voltage has been removed. A holding time is desirable in many applications where the input signal is a periodic signal and it is desirable to maintain a relatively low sensitivity between periodic signals. For example, in conjunction with a radar receiver, it may be desirable to maintain a reduced sensitivity after each return from a target so that sidelobe interference is minimized.

Prior art AGC circuits utilize a peak detector and capacitor storage to drive a variable gain amplifier. These circuits are unsatisfactory because the holding time is severely limited by capacitor value and the inherent leakage of the stored charge, which will result in a relatively rapidly decaying control voltage level during the holding period.

On U.S. Pat. No. 3,579,138, entitled "Automatic Gain Presetting Circuit," issued May 18, 1971, illustrates a circuit including a shift register for providing an incremental AGC voltage. This circuit is designed strictly for presetting the gain of an amplifier and does not teach the generation of a continously variable AGC voltage, an AGC circuit with a holding timer (rather than a preset), or an AGC circuit capable of compensating for certain non-linearities in the amplifier transfer function and in the AGC control characteristics.

SUMMARY OF THE INVENTION

The present invention pertains to an AGC signal generator for controlling the output of a variable amplifier including generating means connected to the output of the amplifier for generating an output signal with an incrementally variable amplitude when the output of the amplifier exceeds an AGC threshold level, the amplitude of the output signal of said generating means increasing in predetermined increments from a reference level and in response to the input signal when the input signal is applied thereto for a period greater than a predetermined interval, the output signal from said generating means controlling the output of the variable amplifier, and timing means responsive to signals at the output of the amplifier and resetting the output signal of the generating means to the reference level when the signal at the output of the amplifier is below a threshold value for a predetermined length of time.

When the output of the amplifier exceeds a predetermined value, a comparator activates a circuit which applies one or more pulses to a shift register. The outputs of the various stages of the shift register are connected in parallel and supply incremental voltage steps to control the amplifier. The output of the amplifier is also utilized to control a timer which resets the shift register when the output of the amplifier is below the threshold value for a predetermined length of time. Thus, the circuit can be set for any desired hold time by setting the predetermined length of time in the timer. Further, additional circuitry is incorporated with the shift register to control the AGC threshold level at which the comparator is actuated so that a wide variety of amplifier transfer or control characteristics can be obtained.

It is an object of the present invention to provide an improved AGC voltage generator.

It is a further object of the present invention to provide an AGC voltage generator with a holding time which may be quickly and easily made as long as desired.

It is a further object of the present invention to provide an AGC voltage generator which can be adjusted to generate a wide variety of amplifier transfer characteristics.

It is further object of the present invention to provide an AGC voltage generator in which the attack time can be altered.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
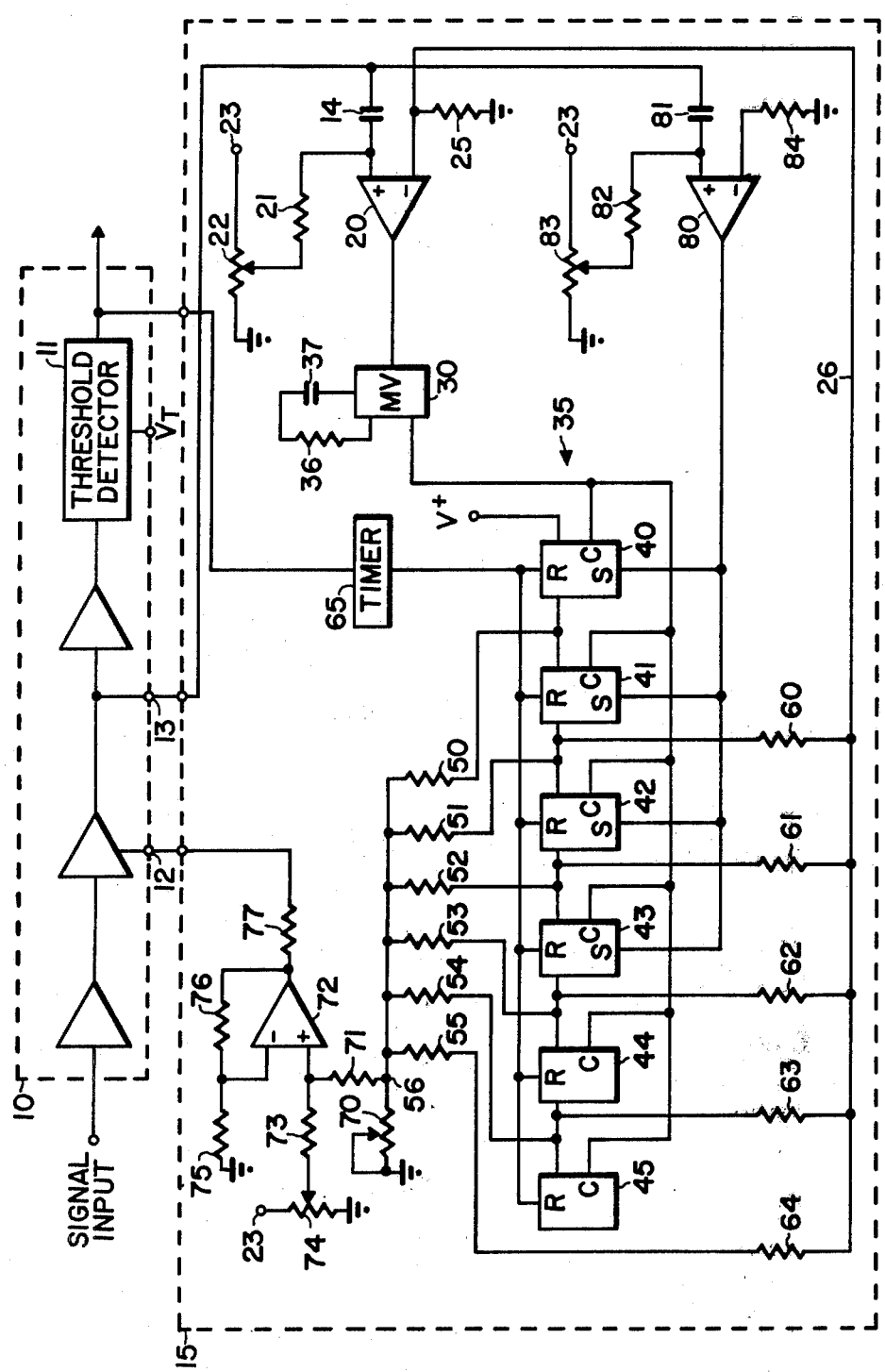
FIG. 1 is a schematic/block diagram of an AGC voltage generator embodying the present invention.

Referring to FIG. 1, an amplifier 10 is illustrated which may be, for example, a video amplifier for use in a radar or the like. The amplifier 10, as illustrated, includes three stages: a preamplifier connected to receive an input signal, a variable gain amplifier connected to the output of the preamplifier and the only stage in which the amplification is controllable, and an output amplifier connected to the output of the variable gain amplifier and feeding a threshold detector 11. It should be understood that the amplifier being controlled could contain as many stages as desired and the amplification of one or more stages could be controlled depending upon the control sensitivity desired. In the event the variable gain amplifier contains a plurality of stages, the outputs of the stages can be summed together and applied to the output 13 to obtain additional dynamic range. Further, the threshold detector 11 is illustrated as a portion of amplifier 10 simply for convenience of illustration. In addition to the input and output for the signal, the amplifier 10 has an AGC input terminal 12 and a terminal 13 to drive the AGC voltage generator, generally designated 15, as will be explained presently.

Figures 2, 3, 4:
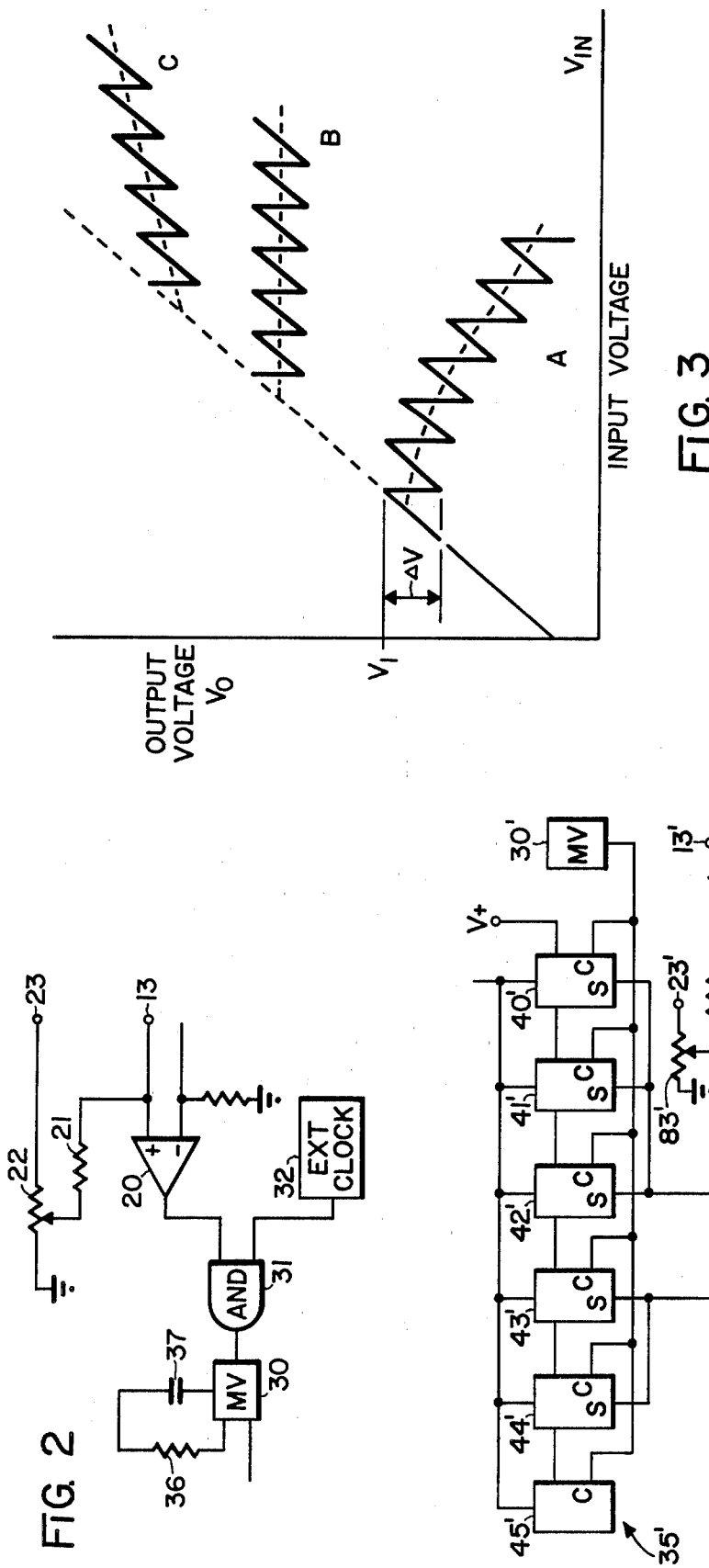
FIG. 2 is a partial schematic/block diagram of a modification of the embodiment illustrated in FIG. 1.
FIG. 3 graphically illustrates several response curves for the embodiment of FIG. 1 utilizing different values of components.
FIG. 4 illustrates a different embodiment of the AGC voltage generator indicating apparatus for shortening the attack time illustrated in FIG. 1.

The output terminal 13 of the amplifier 10 is connected through a capacitor 14 to the positive input of a comparator 20. The positive input of the comparator 20 is also connected through a resistor 21 to the varible resistance tap of a potentiometer 22, which is connected between ground and a terminal 23 adapted to have a positive voltage source supplied thereto. The potentiometer 22 and resistor 21 are connected to apply a voltage of an AGC threshold value to the positive input terminal of the comparator 20, which voltage must be exceeded by the output signal from the amplifier 10 before the comparator 20 is activated. The negative input terminal of the comparator 20 is connected through a resistor 25 to ground and to a lead 26 which will be explained presently. While the comparator 20 is connected to receive a negative pulse it should be understood that it could be connected to receive a positive pulse if desired. The comparator 20 has an output which is connected to the input of a monostable multivibrator 30. If the signal from the amplifier 10 is a pulse train the capacitor 14 may be utilized to provide DC isolation between the amplifier 10 and the comparator 20 and the output of the comparator 20 may be connected directly to the input of the multivibrator 30. However, if the signals from the amplifier 10 are detected continuous wave or DC, the capacitor 14 may be eliminated and the output of the comparator is connected to one input of an AND gate 31, as illustrated in FIG. 2. A second input of the AND gate 31 has an external clock 32 connected thereto and the output is connected to the input of the monostable multivibrator 30. The clock 32 applies pulses to the multivibrator 30 whenever a signal from the comparator 20 is applied to the other terminal of the AND gate 31. Thus, in either embodiment pulses are applied to the multivibrator 30.

The multivibrator 30 is triggered by the input pulses and generates a standard pulse which serves as a clock pulse in a control register which, in this embodiment, is a shift register generally designated 35. To prevent multiple triggering at threshold due to noise and the like, the width of the standard pulse produced by the multivibrator 30 is set to exceed to response time of the AGC loop, i.e., the AGC amplifier and the circuitry connected to the input terminal 12 and output terminal 13. The width of the pulse from the multivibrator 30 is determined by an RC network including a resistor 36 and a capacitor 37. Thus, the width of the pulse from the multivibrator 30 establishes a predetermined minimum interval during which time the signal at the comparator 20 has no further effect. While the interval is determined by the multivibrator 30 in this embodiment, it should be understood that in some embodiments the multivibrator might be eliminated and the interval would then be determined by the response time of the AGC loop.

The control register, in this embodiment, is made up of shift register 35 including 6 stages, 40 through 45, connected to receive the output pulses of the multivibrator 30 in parallel at the clock inputs. The output of each of the stages, 40 through 44, is connected to the input of each succeeding stage and the input of stage 40 is connected to a positive voltage source so that a pulse on the clock inputs causes serial operation of the register 35 and the outputs are further connected in parallel through a resistive adder circuit, including resistors 50 through 55, to a terminal 56. The outputs of the stages 41 though 45 are also connected in parallel through a step control network, including resistors 60 through 64, to the lead 26, which in connected to the negative terminal of the comparator 20 as previously described. Reset inputs for each of the register stages 40 through 45 are connected in parallel and to an output of a timer 65. A reset input of the timer 65 is connected to the output of the threshold detector 11 in amplifier 10. Thus, each time a signal appears at the output of the threshold detector 11 the timer 65 is reset. However, if no signal appears at the output of the threshold detector 11 before the timer 65 times out a signal is applied to the reset inputs of the stages 40 through 45 to reset the shift register 35.

The terminal 56 at the output of the resistive adder is connected through a potentiometer 70 to ground with the variable resistance tap of the potentiometer 70 being connected to ground to vary the resistance at the terminal 56. The terminal 56 is also connected through a resistor 71 to the positive input of an offset amplifier 72. The positive terminal of the amplifier 72 is also connected through a resistor 73 to the variable resistance tap of a potentiometer 74, which is connected between the positive terminal 23 and ground. A negative input terminal of the amplifier 72 is connected to the junction between a pair of resistors 75 and 76, which are connected in series between the output of the amplifier 72 and ground. The output of the amplifier 72 is also connected through a resistor 77 to the input terminal 12 of the amplifier 10.

In the operation of the circuitry, the first clock pulse from the multivibrator 30 applied to the shift register 35 causes the output of the stage 40 to go high, generating a step voltage increase on the resistive adder output, terminal 56. This voltage step is supplied to the offset amplifier 72, which generates a proportional voltage step that is applied to the AGC controlled stage of the amplifier 10. The step voltage will reduce the amplifer gain, reducing the output voltage at the output of the threshold detector 11. For further increase in the input pulse level, the comparator 20 will be triggered again and the second stage 41 of the control register will be set, resulting in another step reduction in the amplifier gain. This process will continue until all the register stages are set. The output voltage for the amplifier 10 is illustrated in FIG. 3A. The size of each gain reduction step is determined by the ratio between the resistors, 50 through 55, in the resistive adder and the poteniometer 70. As a result, large and small steps can be mixed, depending on the requirements. For all steps to be equal, the resistors 50 through 55 in the resistive adder are all of the same value. However, if it is required to adjust each step independently, the loading effect of the network needs to be taken into account. This causes the variation in one of the steps to influence the size of all other steps. This can be minimized by making potentiometer 70 small with respect to the size of the resistors 50 through 55 in the resistive adder, or can be avoided by adding a diode (not shown) in series with each of the resistors 50 through 55.

The low level amplification factor for zero volts output of the resistive adder is adjusted with offset adjust potentiometer 74 feeding the offset amplifier 72 and establishing the reference level. The AGC control sensitivity is determined by three factors:

1. AGC control sensitivity of the amplifier 10;
2. Resistance values of the resistors 50 through 55 in relation to the potentiometer 70; and
3. the gain from terminal 56 to the output of amplifier 72, set by the relative values of resistors 71, 73, 74, 75 and 76, and can be readily calculated by those skilled in the art.

If the signal at the input of the threshold detector 11 has sufficient strength, the detector 11 will detect the presence of a pulse and provide an output which is applied as a reset pulse to the timer 65. The timer 65 generates a pulse to reset the shift register 35 periodically, whenever the amplitude of the signal at the threshold detector 11 falls below the threshold value for a predetermined length of time or a period exceeding the timer interval. Each time the shift register 35 is reset the amplifier 10 is readjusted to its full sensitivity. The predetermined length of time, or reset time, determined by the timer 65 can be generated by digital means and will normally be considerably longer than the slowest repetition period of the incoming signals at the input of the amplifier 10.

For AGC applications, it is required to arrive at the final amplification setting within a certain time, usually referred to as the attack time. In the AGC system illustrated in FIG. 1, the attack time is related to the maximum number of pulses from the multivibrator 30 required to adjust the amplifier 10 to its final gain level. If only a single comparator 20 is used, the six-step control register 35 would require a total of six pulses when a high level signal is suddenly presented to the input of the amplifier 10. This attack time can be reduced to three pulses by using a preset comparator 80. Comparator 80 has a positive input connected through a capacitor 81 to the output terminal 13 of the amplifier 10. The positive input terminal is also connected through a resistor 82 to the variable resistance tap of a potentiometer 83 which is connected between the positive terminal 23 and ground. A negative input terminal of the comparator 80 is connected through a resistor 84 to ground and the output of the comparator 80 is connected to set terminals of the stages 40 through 43 of the shift register 35. Thus, when the output signal at the terminal 13 of amplifier 10 exceeds a second AGC threshold level, determined by the setting of potentiometer 83, the comparator 80 is activated to supply a signal to the set terminals of the stages 40 through 43 so that the shift register 35 immediately proceeds to the fourth step at the output 56 of the resistive adder. Thus, the comparator 80 presets the shift register 35 when the input pulse level exceeds the voltage set by the potentiometer 83. The voltage on the potentiometer 83 is adjusted to just below the level required for activating the fourth stage 43 in the shift register 35 by the comparator 20. If a shorter attack time is required, additional comparators can be utilized, as illustrated in FIG. 4 where similar components are designated with similar numbers and all numbers have a prime added to indicate a different embodiment.

In FIG. 4, the output of the comparator 80' is connected to the set terminals of stages 40', 41' and 42' of the shift register 35'. A second comparator 86', which is connected similar to the connections described for the comparator 80', has an output connected to the set terminals of the stages 43' and 44' of the shift register 35'. The voltage required on the potentiometer associated with the comparator 86' is adjusted to just below the level required for activating the fifth stage 44' by the comparator 20' (not shown in FIG. 4). Thus, the circuitry illustrated in FIG. 4 has two-pulse attack time. As a general rule, in $N_r$ is the register size, and $n_a$ the maximum number of pulses allowed to meet the attack time, the number of required comparators is: $N^r/n_a$.

The step control network in FIG. 1, including resistor 60 through 64, is used to generate the response curves shown in FIGS. 3A, B and C. The voltage generated by this network is applied to the negative input terminal of the comparator 20 across the resistor 25 and lowers the threshold level of the comparator 20. In the embodiment illustrated in FIG. 1, the threshold level is only lowered after the second stage 41 is activated. The resulting response is illustrated in the curve of FIG. 2A. Depending on how the step control network is connected to the comparator 20, the response curve can be tilted downward, remain level or be tilted upward as illustrated in FIG. 3A, B and C, respectively. The use of the step control network together with the potentiometer 70 which controls the step size at the output of the resistive adder, provides the flexibility to give the amplifier 20 almost any desired transfer response as illustrated in FIG. 3, A, B and C.

Thus, an AGC voltage generator is disclosed which offers great flexibility in the characterization of the input-output response for the amplifier 10, in the following ways. The AGC voltage generator can be adjusted to compensate for certain non-lineararity in the amplifier transfer function as well as in the AGC control characteristic. The AGC response time, as a function of signal level, can be simply adjusted as a function of the number of detected pulses. The AGC hold time can be varied from a very short to a near infinite time span. The design does not require the use of high impedence, long time constant circuits (with their inherent leakage problems), commonly used in other AGC schemes requiring long hold times. Further, the circuit will function equally well with a linear DC or AC amplifier by using the separate clock generator 32, illustrated in FIG. 2, to drive the AGC control register. While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. An AGC signal generator for controlling the output of a variable gain amplifier comprising generating means connected to the output of the amplifier for generating an output signal with an incrementally variable amplitude in response to the application thereto of an input signal exceeding an AGC threshold level, said generating means further causing the amplitude of the output signal thereof to increase in predetermined increments from a reference level in response to the application of the input signal in excess of the AGC threshold level for a period greater than a predetermined interval, the output signal from said generating means being coupled to control the output of the variable amplifier, and timing means responsive to signals at the output of the amplifier and connected to said generating means for returning the output signal thereof to the reference level when the signal at the output of the amplifier is below a threshold value for a predetermined length of time.

2. An AGC signal generator for controlling the output of an amplifier comprising:
   a. means for sensing the amplitude of the output of the amplifier and providing an output signal when the output of the amplifier exceeds an AGC threshold level;
   b. incremental means coupled to receive an input signal indicative of the output signal from said sensing means for providing an output signal with an incrementally variable amplitude in response to the application of the output signal from said sensing means, said incremental means further causing the amplitude of the output signal thereof to increase in predetermined increments from a reference level in response to the application of the output signal from said sensing means for a period greater than a predetermined interval;

c. coupling means connected to receive the output signal from said incremental means and utilize the output signal to control the output of the amplifier; and d. timing means responsive to the output of the amplifier and connected to said incremental means for returning the output signal of said incremental means to the reference value when the output of the amplifier is below a threshold value for a predetermined length of time.

3. An AGC signal generator as claimed in claim 2 wherein the sensing means includes a first comparator having a reference signal of the AGC threshold level connected thereto and the output of the amplifier also connected thereto.

4. An AGC signal generator as claimed in claim 3 wherein the incremental means includes a shift register with a plurality of stages and a plurality of outputs connected to provide a plurality of predetermined increments from the reference level as pulses are applied to said shift register.

5. An AGC signal generator as claimed in claim 4 wherein the incremental means further includes means for converting the output signal of the sensing means into pulses for application to the shift register.

6. An AGC signal generator as claimed in claim 4 wherein the incremental means further includes resistive adder means connected to the plurality of outputs of the shift register for providing the plurality of predetermined increments.

7. An AGC signal generator as claimed in claim 4 wherein the timing means includes threshold detecting means connected to the output of the amplifier and supplying an output signal only when the output of the amplifier exceeds the threshold value, and a timer connected to be reset by output signals from the threshold detecting means and further connected to reset the shift register in the absence of an output signal from the threshold detecting means when the timer times-out after the predetermined length of time.

8. An AGC signal generator as claimed in claim 4 wherein the sensing means includes a second comparator connected to the output of the amplifier and to the shift register and constructed to activate said shift register to a predetermined one of the predetermined increments upon the output of the amplifier exceeding a second AGC threshold level greater than the first AGC threshold level.

9. An AGC signal generator as claimed in claim 4 wherein increment control means are connected to the shift register and to the comparator for altering the AGC threshold level which the output of the amplifier must exceed to activate the comparator, in a predetermined pattern as the plurality of stages of the shift register are activated.

* * * * *